(12) United States Patent
Zhong et al.

(10) Patent No.: US 8,987,136 B2
(45) Date of Patent: Mar. 24, 2015

(54) SEMICONDUCTOR DEVICE AND METHOD FOR MANUFACTURING LOCAL INTERCONNECT STRUCTURE THEREOF

(75) Inventors: Huicai Zhong, San Jose, CA (US); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 582 days.

(21) Appl. No.: 13/380,061

(22) PCT Filed: Feb. 27, 2011

(86) PCT No.: PCT/CN2011/071346
§ 371 (c)(1),
(2), (4) Date: Dec. 22, 2011

(87) PCT Pub. No.: WO2012/022144
PCT Pub. Date: Feb. 23, 2012

(65) Prior Publication Data
US 2012/0261727 A1    Oct. 18, 2012

(30) Foreign Application Priority Data
Aug. 20, 2010 (CN) .......................... 2010 1 0259626

(51) Int. Cl.
*H01L 21/44* (2006.01)
*H01L 21/336* (2006.01)
*H01L 21/8234* (2006.01)
*H01L 29/78* (2006.01)
*H01L 21/768* (2006.01)

(52) U.S. Cl.
CPC .......... *H01L 29/78* (2013.01); *H01L 21/76895* (2013.01); *H01L 21/76897* (2013.01)
USPC ............................ 438/675; 438/149; 438/599

(58) Field of Classification Search
CPC .............. H01L 29/78; H01L 21/76897; H01L 21/76895; H01L 29/772; H01L 21/768
USPC .......................................... 438/149, 599, 675
See application file for complete search history.

(56) References Cited

U.S. PATENT DOCUMENTS

| | | | |
|---|---|---|---|
| 5,960,270 A | 9/1999 | Misra et al. | |
| 6,087,706 A * | 7/2000 | Dawson et al. | ............... 257/520 |
| 6,635,536 B2 | 10/2003 | Shin et al. | |

OTHER PUBLICATIONS

International Preliminary Report on Patentability issued in PCT/CN2011/071346 dated Mar. 7, 2013 (5 pages).
International Search Report from PCT/CN2011/071346 dated Jun. 9, 2011 (3 pages).
Written Opinion from PCT/CN2011/071346 dated Jun. 9, 2011 (4 pages).

* cited by examiner

*Primary Examiner* — Khiem D Nguyen
*Assistant Examiner* — Wilner Jean Baptiste
(74) *Attorney, Agent, or Firm* — Osha Liang LLP

(57) ABSTRACT

A semiconductor device and a method for manufacturing a local interconnect structure for a semiconductor device is provided. The method includes forming removable sacrificial sidewall spacers between sidewall spacers and outer sidewall spacers on two sides of a gate on a semiconductor substrate, and forming contact through-holes at source/drain regions in the local interconnect structure between the sidewall spacer and the outer sidewall spacer on the same side of the gate immediately after removing the sacrificial sidewall spacers. Once the source/drain through-holes are filled with a conductive material to form contact vias, the height of the contact vias shall be same as the height of the gate. The contact through-holes, which establish the electrical connection between a subsequent first layer of metal wiring and the source/drain regions or the gate region at a lower level in the local interconnect structure, shall be made in the same depth.

12 Claims, 12 Drawing Sheets

SEMICONDUCTOR DEVICE AND METHOD FOR MANUFACTURING LOCAL INTERCONNECT STRUCTURE THEREOF

CROSS REFERENCE TO RELATED APPLICATION

This application is a National Phase application of PCT Application No. PCT/CN2011/071346, filed on Feb. 27, 2011, entitled "Semiconductor Device and Method for Manufacturing Local Interconnect Structure Thereof", which claims priority to Chinese Application No. 201010259626.6, filed on Aug. 20, 2010. Both the PCT Application and the Chinese Application are incorporated herein by reference in their entireties.

FIELD OF THE INVENTION

The present invention relates to the field of semiconductor manufacturing, and specifically, relates to a semiconductor device and a method for manufacturing a local interconnect structure thereof.

BACKGROUND OF THE INVENTION

In the back end interconnect process of manufacturing a semiconductor device, it is necessary to establish electrical connection between a first layer of metal wiring and an active device structure at a lower level having both source/drain regions and a gate region. Accordingly, a local interconnect structure of the semiconductor device must be formed in advance before formation of the first layer of metal wiring. The local interconnect structure comprises contact through-holes for connecting the first layer of metal wiring with the source/drain regions or the gate region at a lower level. However, the contact through-holes at the source/drain regions and the gate region of the semiconductor device usually do not have the same length. For example, FIG. 1 illustrates contact through-holes formed between a first layer of metal wiring and source/drain regions or a gate region at a lower level in the prior art. As shown in FIG. 1, the contact through-holes 101, 103 at the source/drain regions and the contact through-holes 105, 107 at the gate regions of the semiconductor device are not in the same depth, which consequently makes it difficult to etch contact through-holes at different regions in a local interconnect structure and to deposit conductive materials.

Specifically, since the contact through-holes at the source/drain regions and the gate regions are not in the same depth, it is hard to control the time for stopping etching of the contact through-holes in the local interconnect structure. If the etching is stopped when the bottom of the contact through-hole at the gate region comes into contact with the gate, then the bottoms of the contact through-holes at the source/drain regions usually do not have a sufficient depth to be in contact with the source/drain regions. As a result, the bottoms of the contact through-holes at the source/drain regions will be separated from the source/drain regions by local interconnect dielectric, and thus may not be electrically connected with the source/drain regions. However, if the etching is stopped when the bottoms of the contact through-holes at the source/drain regions come into contact with the source/drain regions, then the bottom of the contact through-hole at the gate region shall extend into the gate, which would bring about over-etching of the gate and destroy integrity of the gate. Furthermore, it is likely to cause excessive gate leakage current in the gate dielectric layer below the gate, and thus cause unfavorable effects on controlling of switch for the semiconductor device.

Therefore, there is an urgent need for a method capable of forming contact through-holes at different regions in a local interconnect structure in back end local interconnect process for manufacturing a semiconductor device, and preventing over-etching of contact through-holes at gate regions (hereinafter referred to as gate through-holes) or under-etching of contact through-holes at source/drain regions (hereinafter referred to as source/drain through-holes).

SUMMARY OF THE INVENTION

The problem that the present invention solves is to provide a semiconductor device and a method for fabricating a local interconnect structure thereof, so as to get rid of over-etching or insufficient etching occurring at formation of contact through-holes at different regions of a semiconductor device.

In order to solve aforesaid problems, the present invention provides a method for manufacturing a local interconnect structure for a semiconductor device, comprising: providing a semiconductor substrate with a gate, wherein the gate is sealed by a cap layer and sidewall spacers; forming sacrificial sidewall spacers outside the sidewall spacers; forming outer sidewall spacers at outer sides of the sacrificial sidewall spacers, wherein the material of the sacrificial sidewall spacers is different from the materials of the sidewall spacers and the outer sidewall spacers; removing the sacrificial sidewall spacers, forming source/drain through-holes between the sidewall spacers and the outer sidewall spacers which are located on the same side, and then forming sacrificial source/drain in the source/drain through-holes; and depositing an interlayer dielectric layer which is made of a material different from that of the sacrificial source/drain; performing planarization and removing the sacrificial source/drain; forming source/drain contacts at bottom of the source/drain through-holes; depositing a conductive material to fill the source/drain through-holes so as to form contact vias; and performing planarization to expose the gate and the contact vias.

Optionally, at the step of performing planarization and removing the sacrificial source/drain: planarization is performed to expose the sacrificial source/drain, and then the sacrificial source/drain is removed.

Optionally, at the step of performing planarization and removing the sacrificial source/drain: planarization is performed to expose the cap layer, the interlayer dielectric layer is etched to expose the sacrificial source/drain, and then the sacrificial source/drain is removed.

Optionally, after performing planarization to expose the gate and the sacrificial source/drain, the method further comprises removing the gate and a gate dielectric layer therebelow to form a new gate and a new gate dielectric layer.

Optionally, after performing planarization to expose the gate and the vias, the method further comprises removing the gate and the gate dielectric layer therebelow to form a new gate and a new gate dielectric layer.

Optionally, the new gate is formed with a metal material.

Optionally, after performing planarization to expose the gate and the vias, the method further comprises removing the sidewall spacers or the outer sidewall spacers, and then forming new sidewall spacers or new outer sidewall spacers.

Optionally, the new sidewall spacers or the new outer sidewall spacers are made of a low-k material or a $Si_3N_4$ stressed thin film.

Optionally, the cap layer and the sidewall spacers are made of $Si_3N_4$, the sacrificial sidewall spacers at outer sides of the sidewall spacers are made of $SiO_2$, and the outer sidewall spacers at outer sides of the sacrificial sidewall spacers are made of $Si_3N_4$.

Optionally, the outer sidewall spacers are located over the source/drain of the semiconductor device or extend over a shallow trench isolation between neighboring semiconductor devices.

Optionally, the sacrificial source/drain are grown by means of a Molecular Beam Epitaxy method.

Optionally, the sacrificial source/drain is Si, SiGe or Si:C.

The present invention further provides a semiconductor device having a local interconnect structure for semiconductor device manufactured according to aforesaid method, comprising: a semiconductor substrate with a gate and sidewall spacers formed on two sides of the gate; outer sidewall spacers which are formed at outer sides of the sidewall spacers at a certain spacing distance, and source/drain through-holes formed between the sidewall spacers and the outer sidewall spacers which are located on the same side; a conductive material filled into the source/drain through-holes; and an interlayer dielectric layer filled into recesses between the outer sidewall spacers of neighboring semiconductor devices.

Optionally, the sidewall spacers are made of $Si_3N_4$, and the outer sidewall spacers are made of $Si_3N_4$.

Optionally, the outer sidewall spacers extend over a shallow trench isolation between neighboring semiconductor devices.

Optionally, the heads of the gate, the sidewall spacers, the outer sidewall spacers and the conductive material are at the same level.

As compared to the prior art, the present invention exhibits following advantages: sacrificial sidewall spacers are formed between the sidewall spacers and outer sidewall spacers on the semiconductor substrate, and after the sacrificial sidewall spacers are removed, the contact through-holes of the source/drain regions are formed immediately between the sidewall spacer and outer sidewall spacer on the same side of the gate. After the conductive material is filled into the source/drain through-holes to form vias, the height of the vias shall be same as the height of the gate. As such, in a local interconnect structure, the contact through-holes, which establishes electrical connection between the subsequent first layer of metal wiring and the source/drain regions or the gate region, shall be in the same depth; therefore, over-etching or insufficient etching is prevented from occurring to the contact through-holes during formation of the contact through-holes at different regions in the semiconductor device, and the filling effects on the contact through-holes are also improved at the meantime.

The present invention may integrate the Gate Last Technique at different stages, and newly form gates of different metal materials, and also may further optimize the threshold voltage (Vth) and the saturated drain current (Idsat) between the source and the drain of the semiconductor device.

It is also applicable in the present invention that the sidewall spacers and outer sidewall spacers on two sides of the gate may be removed after formation of a local interconnect structure, then new sidewall spacers or outer sidewall spacers may be formed again, and the material for the new sidewall spacers or the outer sidewall spacers may be a low-k material or a $Si_3N_4$ stressed thin film. The use of a low-k material is able to reduce the dielectric constants of a local interconnect dielectric/an interlayer dielectric layer, to reduce gate parasitic capacitance and thus to improve performance of a device; meanwhile, the $Si_3N_4$ stressed thin film exhibits effects of pulling and pressing the channel material under the gate, so as to improve carrier mobility at the channel region, thereby enhancing the reaction speed of the semiconductor device.

The outer sidewall spacers on the two sides of the gate in the present invention may be located over the source/drain of the semiconductor device, and also may extend till partly or entirely over the shallow trench isolation between the neighboring semiconductor devices; therefore, it becomes possible to adjust flexibly the widths or positions of source/drain through-holes according to the needs of the widths of source/drain through-holes in practice, so as to improve utilization of chip area and to reduce manufacturing cost as well.

According to aforesaid technical solution, the present invention is able to manufacture contact through-holes, which establishes electrical connection between the subsequent first layer of metal wiring and the source/drain regions or the gate region at a lower level in the local interconnect structure, in a same depth, and to flexibly arrange the widths or positions of the contact through-holes so as to adjust the depth to width ratio of the contact through-holes into a reasonable range, at which a conductive material shall be easily filled; thus it becomes convenient to use a metal material like Cu as the conductive material to fill the contact through-holes, which thus is favorable for improving electrical mobility effects of metal interconnect wiring and also improving both yield and reliability of the product.

DETAILED DESCRIPTION OF THE INVENTION

The present invention is further described with the specific exemplary embodiments and the accompanying drawings, but it will be understood that they should not be interpreted as limits to the present invention.

Figure 1:
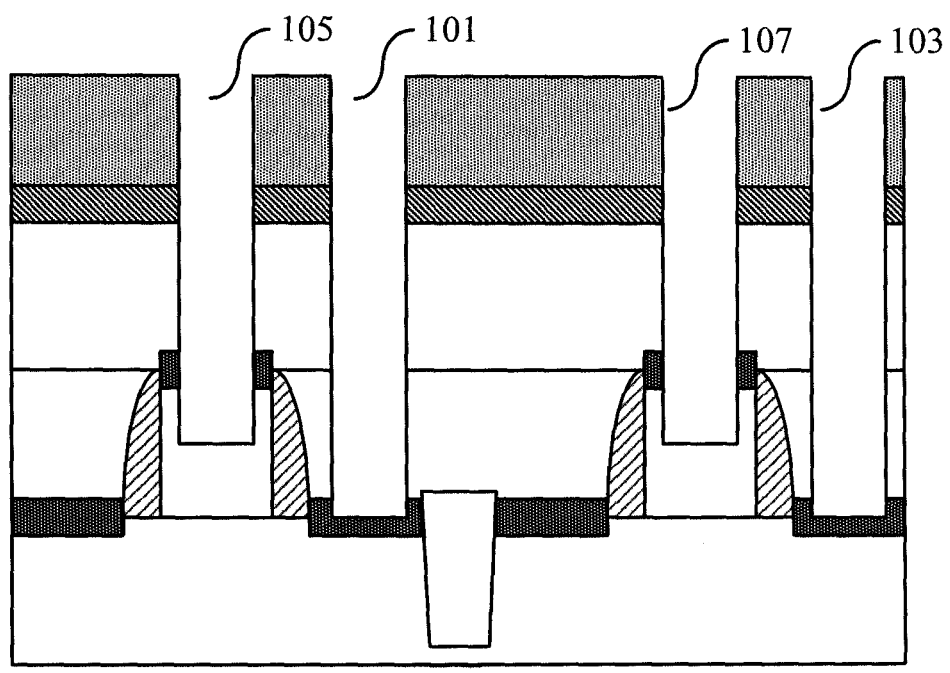
FIG. 1 illustrates contact through-holes formed between a first layer of metal wiring and source/drain regions or a gate region at a lower level in the prior art.
Figure 2:
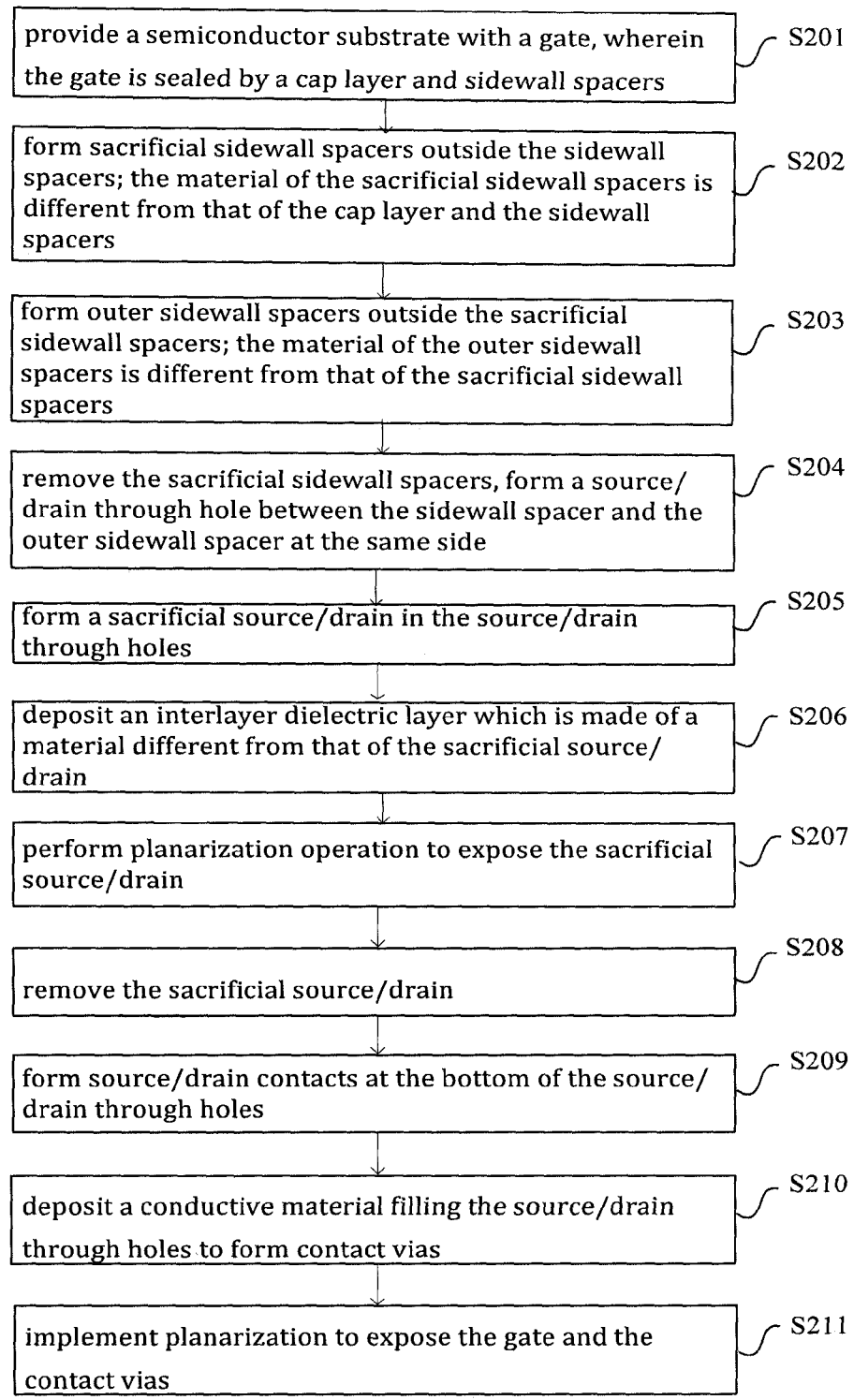
FIG. 2 is a flowchart of a method for manufacturing a local interconnect structure for a semiconductor device according to an embodiment of the present invention.

FIG. 2 is a flow chart of a method for manufacturing a local interconnect structure for semiconductor device of an embodiment of the present invention. As shown in FIG. 2, the method comprises: performing step S201 to provide a semiconductor substrate with a gate, wherein the gate is surrounded by a cap layer and sidewall spacers; performing step S202 to form sacrificial sidewall spacers outside the sidewall spacers, wherein the material for the sacrificial sidewall spacers is different from the material for the cap layer and the sidewall spacers; performing step S203 to form outer sidewall spacers outside the sacrificial sidewall spacers, wherein the material for the outer sidewall spacers is different from the material for the sacrificial sidewall spacers; performing step S204 to remove the sacrificial sidewall spacers and to form source/drain through-holes between the sidewall spacer and the outer sidewall spacer on the same side; performing step S205 to form sacrificial source/drain within the source/drain through-holes; performing step S206 to deposit an interlayer dielectric layer, whose material is different from the material for the sacrificial source/drain; performing step S207 to implement planarization operation to expose the sacrificial source/drain; performing step S208 to remove the sacrificial source/drain; performing step S209 to form source/drain contacts at the bottoms of the source/drain through-holes; performing step S210 to deposit a conductive material and to fill the source/drain through-holes to form vias; and performing step S211 to implement planarization operation till the gate and the vias are completely exposed.

Figure 3:
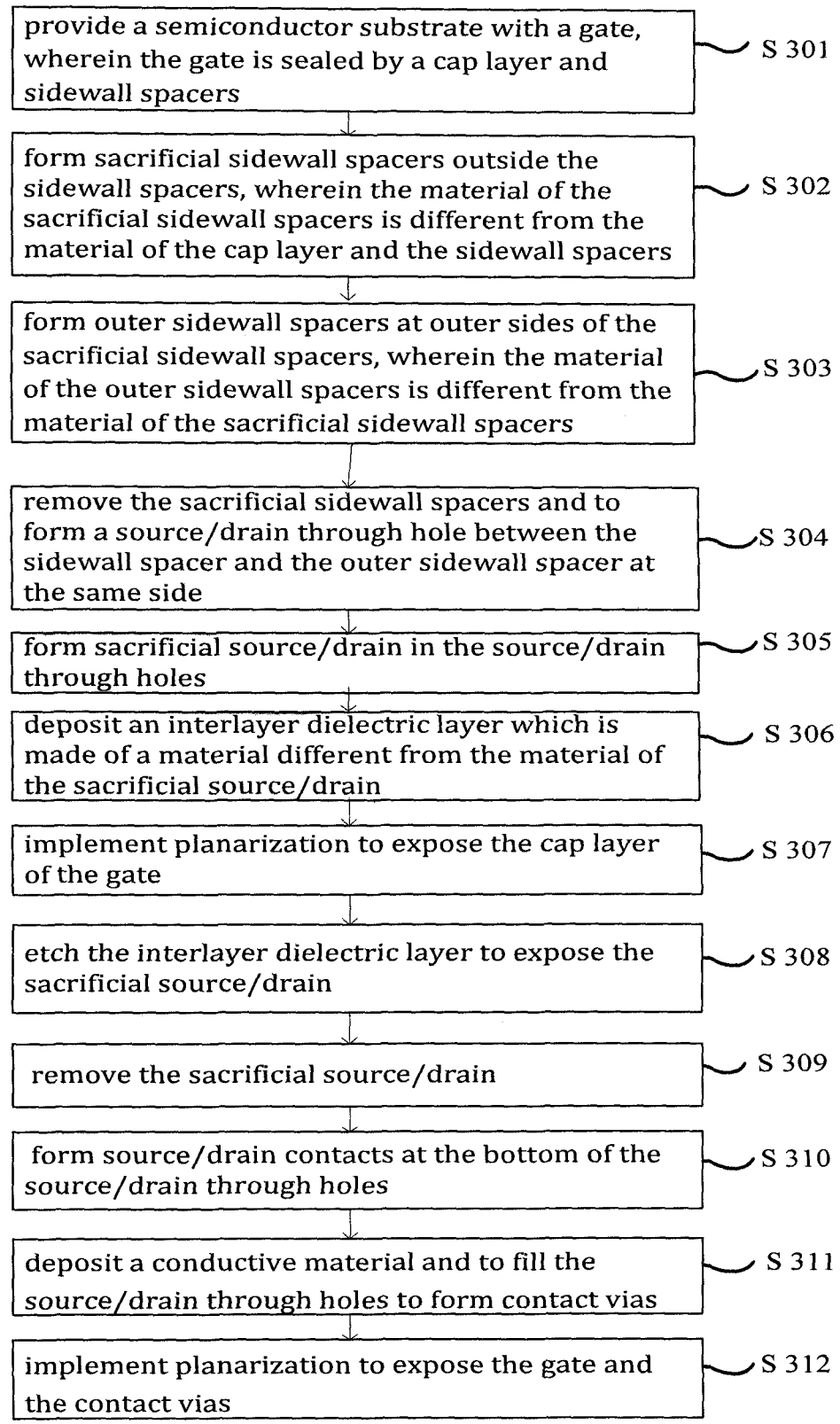
FIG. 3 is a flowchart of a method for manufacturing a local interconnect structure for a semiconductor device according to another embodiment of the present invention.

FIG. 3 is a flowchart of a method for fabricating a local interconnect structure for semiconductor device of another embodiment of the present invention. As shown in FIG. 3, the method comprises: performing step S301 to provide a semiconductor substrate with a gate, wherein the gate is surrounded by a cap layer and sidewall spacers; performing step S302 to form sacrificial sidewall spacers outside the sidewall spacers, wherein the material for the sacrificial sidewall spacers is different from the material for the cap layer and the sidewall spacers; performing step S303 to form outer sidewall spacers outside the sacrificial sidewall spacers, wherein the material for the outer sidewall spacers is different from the material for the sacrificial sidewall spacers; performing step S304 to remove the sacrificial sidewall spacers and to form source/drain through-holes between the sidewall spacer and the outer sidewall spacer on the same side; performing step S305 to form sacrificial source/drain within the source/drain through-holes; performing step S306 to deposit an interlayer dielectric layer, whose material is different from the material for the sacrificial source/drain; performing step S307 to implement planarization operation to expose the cap layer on top of the gate; performing step S308 to etch the interlayer dielectric layer till the sacrificial source/drain are exposed; performing step S309 to remove the sacrificial source/drain; performing step S310 to form source/drain contacts at the bottoms of the source/drain through-holes; performing step S311 to deposit a conductive material filling into the source/drain through-holes to form vias; and performing step S312 to implement planarization operation till the gate and the vias are completely exposed.

Figure 4:
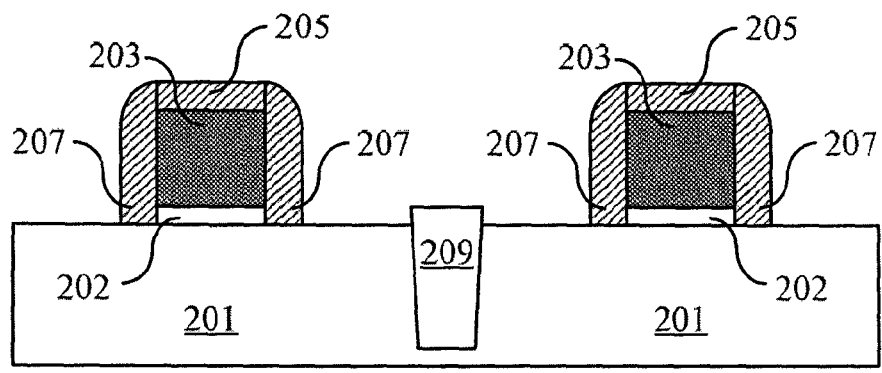
FIGS. 4-14 are cross-sectional views of intermediate structures of a local interconnect structure of a semiconductor device manufactured according to an embodiment of the present invention.

FIG. 4 to FIG. 14 illustrate the cross-sectional structural diagrams of a local interconnect structure of semiconductor device manufactured according to an embodiment of the present invention. As shown in FIG. 4, a semiconductor substrate 201, on which a gate dielectric layer 202 is positioned, is provided; a patterned gate 203 is positioned on the gate dielectric layer 202, and the gate 203 is surrounded by a cap layer 205 on its head and sidewall spacers 207 on its two sides; the neighboring semiconductor devices are isolated by a shallow trench isolation 209.

Optionally, the sidewall spacers 207 and the cap layer 205 may be used as a mask to implement ion implantation at the source/drain, so as to form source/drain regions (not shown) in the semiconductor substrate on two sides of the sidewall spacers 207. For other embodiments of the present invention, angle tilt ion implantation may be performed before formation of sidewall spacers 207 to form source/drain extension regions or a Halo implant region. The source/drain regions also may be formed through other methods.

In the present embodiment, the gate 203 may be polycrystalline silicon, Ti, Co, Ni, Al, W, alloy or a metal silicide; the cap layer 205 and the sidewall spacers 207 may be made of $Si_3N_4$, $SiO_2$ or SiON, etc.; the length of the gate 203 may be 10~50 nm, and the width of the sidewall spacers 207 may be 10~30 nm.

Figure 5:
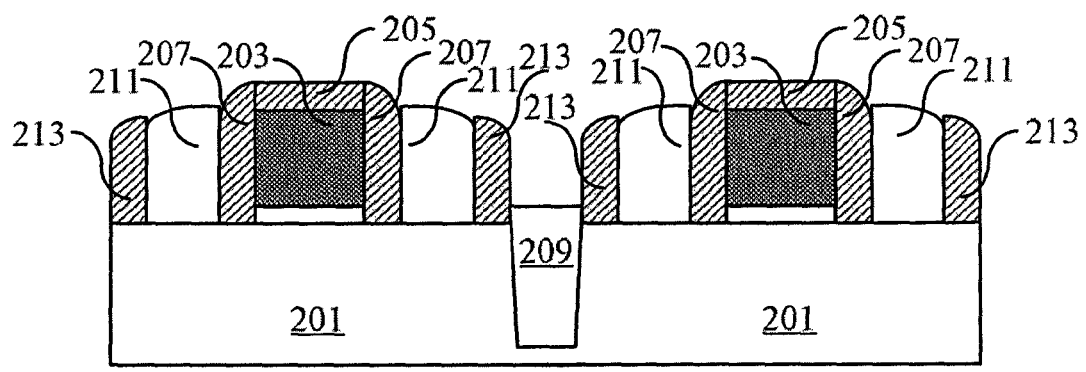

As shown in FIG. 5, sacrificial sidewall spacers 211 are formed outside the sidewall spacers 207, wherein the material for the sacrificial sidewall spacers 211 is different from the material for the cap layer 205 and the sidewall spacers 207.

In the present embodiment, the sacrificial sidewall spacers 211 may be made of $Si_3N_4$, $SiO_2$ or SiON, and the width of the sacrificial sidewall spacers 211 may be greater than 10 nm. The semiconductor substrate under the sacrificial sidewall spacers corresponds to at least a portion of the source/drain regions of the device, and the width of the sacrificial sidewall spacers is same as the width of source/drain through-holes to be formed. Accordingly, it becomes easy to adjust the width of the source/drain through-holes of the device in the embodiment of the present invention. However, because the device size in the prior art is scaling down, thus precision of lithography and etching becomes increasingly demanding, whereas the embodiment of the present invention overcomes such an issue.

Next, outer sidewall spacers 213 are formed outside the sacrificial sidewall spacers 211; the material for the outer sidewall spacers 213 is different from the material for the sacrificial sidewall spacers 211; the spacing distance between the sidewall spacer 207 and the outer sidewall spacer 213 on the same side of the gate 203 is same as the width of source/drain through-holes to be formed in the local interconnect structure.

In the present embodiment, the outer sidewall spacers 213 may be made of $Si_3N_4$, $SiO_2$ or SiON, and the width of the outer sidewall spacers 213 may be greater than 10 nm; additionally, the outer sidewall spacers 213 may be located over the source/drain of the semiconductor device, or may extend till partly or entirely over the shallow trench isolation between the neighboring semiconductor devices.

Figure 6:
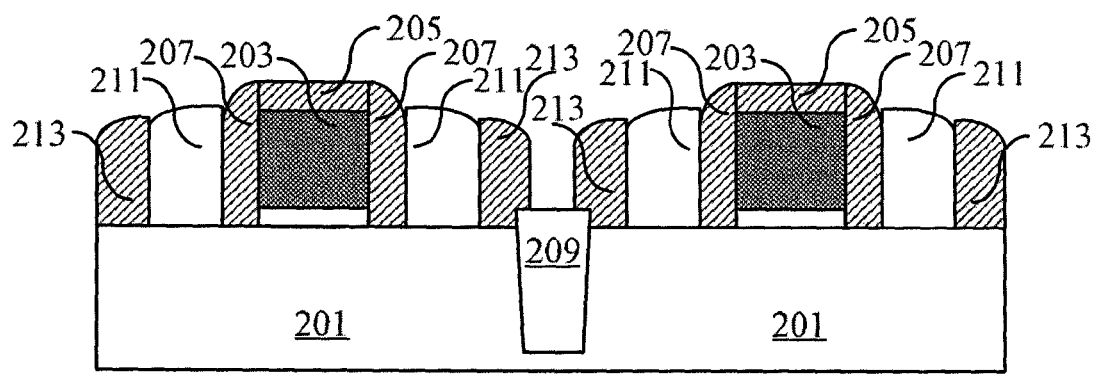

In the various embodiments of the present invention, with regard to the practical demands of width or position of the contact through-hole at the gate region, the outer sidewall spacers 213 also may be formed partly or completely on the shallow trench isolation 209 between the neighboring semiconductor devices, as shown in FIG. 6.

Figure 7:
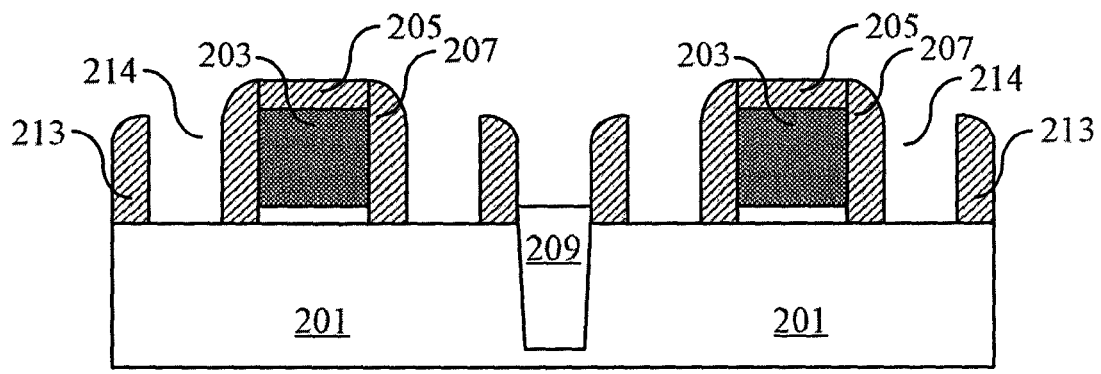

As shown in FIG. 7, in view that the material for the sacrificial sidewall spacers 211 is different from the material for the cap layer 205, the sidewall spacers 207 and the outer sidewall spacers 213, thus the sacrificial sidewall spacers 211 are removed, and source/drain through-holes 214 are formed between the sidewall spacer 207 and the outer sidewall spacer 213 on the same side of the gate 203.

In the present embodiment, the sacrificial sidewall spacers 211 may be removed by means of wet etching, wherein the solution for wet etching may be HF.

Figure 8:
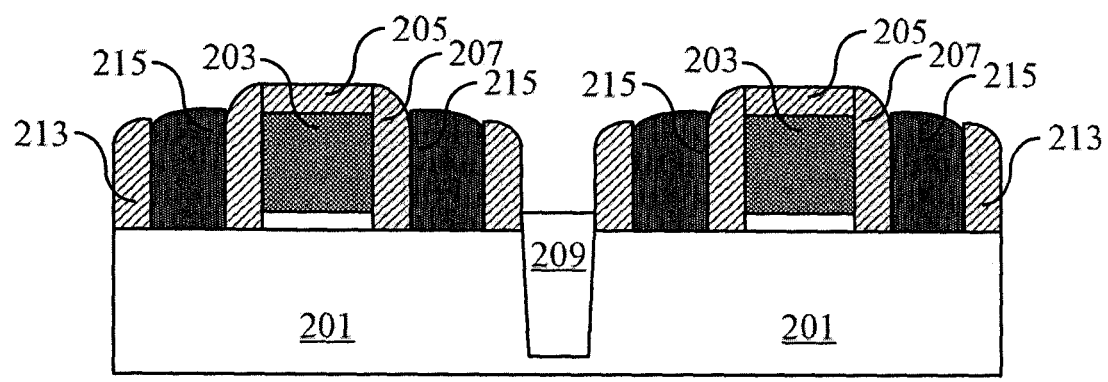

As shown in FIG. 8, sacrificial source/drain 215 are formed within the source/drain through-holes 214.

In the present embodiment, the sacrificial source/drain 215 may be formed by means of Molecular Beam Epitaxy (MBE) method; the sacrificial source/drain 215 may be Si, SiGe or Si:C.

As for other embodiments of the present invention, if no source/drain has been formed at foregoing steps, then the source/drain may be formed after removal of the sacrificial sidewall spacers 211. For example, ion implantation may be performed to the semiconductor substrate to form source/drain regions; alternatively, recesses are formed by way of further etching downwards the semiconductor substrate within the source/drain through-holes 214, and then the source/drain regions are grown epitaxially within the recesses. The method for forming the source/drain regions may be selected according to the needs in practice.

Figure 9:
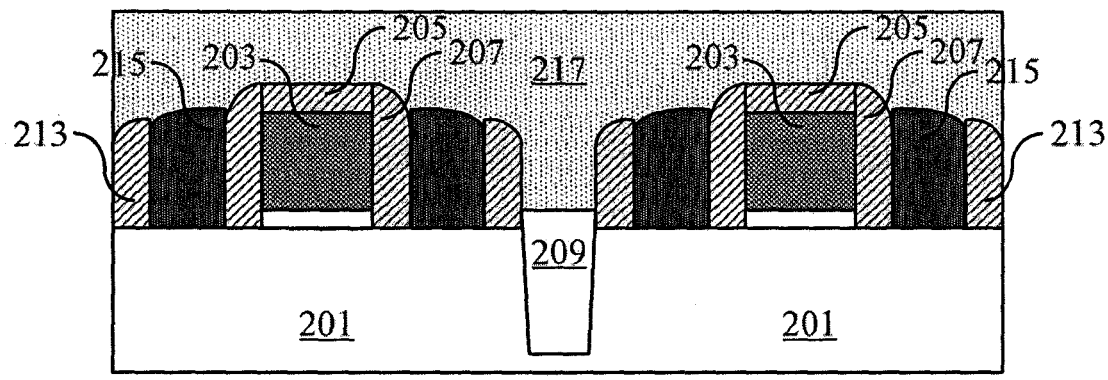

As shown in FIG. 9, an interlayer dielectric layer 217 is deposited on the entire crystal surface, on which the semiconductor device is positioned; the interlayer dielectric layer 217 fills the recesses between the outer sidewall spacers of the neighboring semiconductor devices; and the material for the interlayer dielectric layer 217 is different from the material for the sacrificial source/drain 215.

In the present embodiment, the interlayer dielectric layer 217 may be a low-k material, for example, $SiO_2$, SiOF, SiCOH, SiO, SiCO, SiCON, SiON, PSG or BPSG, etc.

Figure 10:
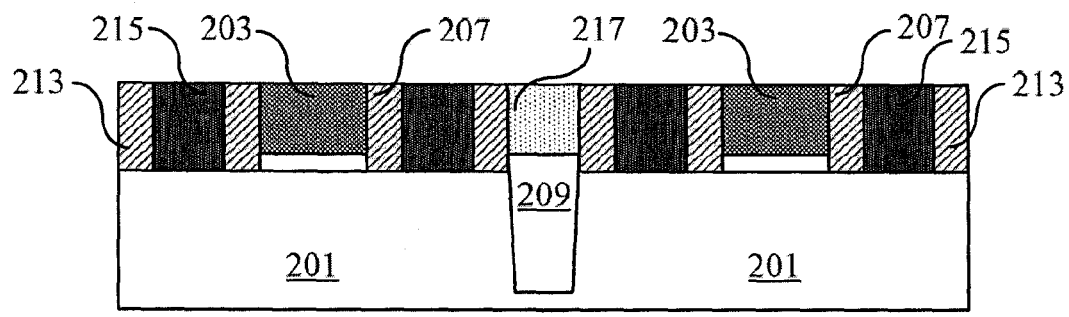

As shown in FIG. 10, the entire crystal surface is planarized till the gate 203 and the sacrificial source/drain 215 are exposed.

In various embodiments of the present invention, the Gate Last Technique may be integrated after aforesaid step; namely, the gate 203 and the gate dielectric layer therebelow are removed after the gate is exposed, then a new gate and a gate dielectric layer are formed again; the new gate may be made of a metal material, while the gate dielectric layer may be made of a high-k material.

Figure 11:
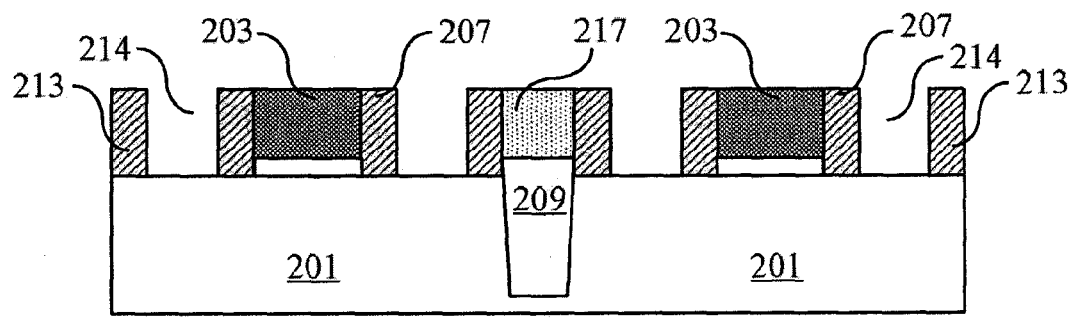

As shown in FIG. 11, the sacrificial source/drain 215 are removed to expose the source/drain regions on the semiconductor substrate 201; source/drain through-holes 214 are formed again between the sidewall spacer 217 and the outer sidewall spacer 213 on the same side of the gate 203.

In the present embodiment, the sacrificial source/drain 215 may be removed by means of dry etching or wet etching.

As for other embodiments of the present invention, if no source/drain is formed at foregoing steps, then source/drain may be formed after removal of the sacrificial source/drain 215. For example, ion implantation may be performed to the semiconductor substrate to form the source/drain; alternatively, recesses are formed by way of further etching downwards the semiconductor substrate in the source/drain through-holes 214, then source/drain regions are grown epitaxially within the recesses. The method for forming the source/drain regions may be selected according to the needs in practice.

Figure 12:
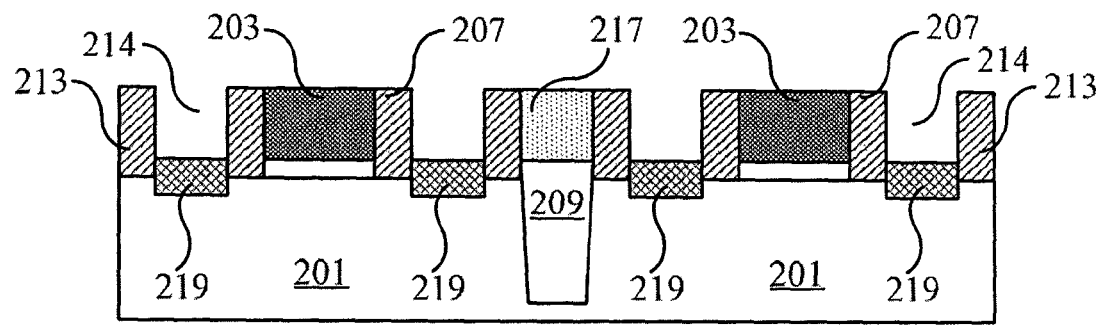

As shown in FIG. 12, source/drain contacts 219 of the local interconnect structure are formed at the source/drain regions at the bottoms of the source/drain through-holes 214.

In the present embodiment, the source/drain contacts 219 may be NiSi.

Figure 13:
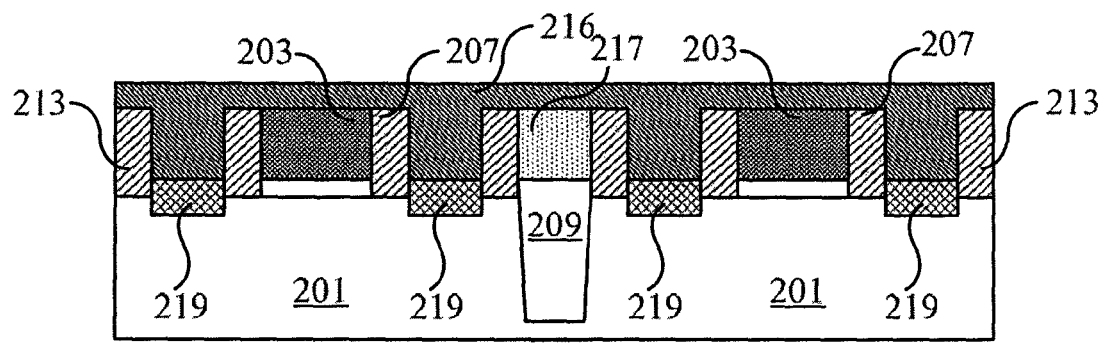

Then, as shown in FIG. 13, a conductive material 216 is deposited on the entire crystal surface, on which the semiconductor device is positioned; the conductive material 216 is filled into the source/drain through-holes 214 to form vias of the local interconnect structure.

In the present embodiment, the conductive material 216 may be Cu, W, Al or TiAl, etc.

Figure 14:
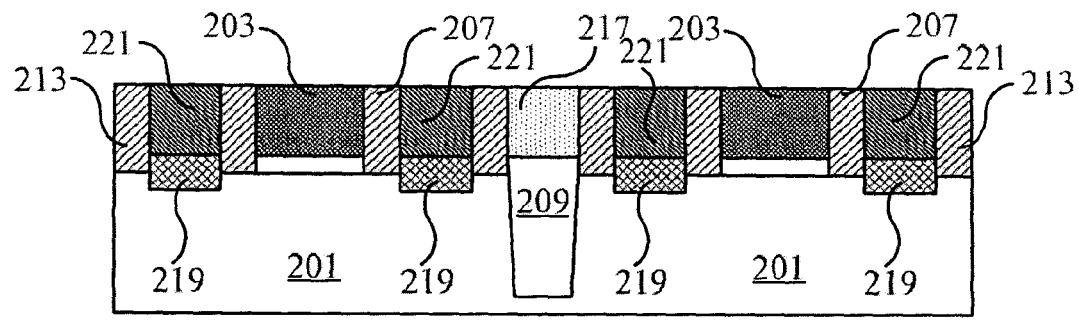

Finally, as shown in FIG. 14, the entire crystal surface is planarized till the gate 203 and the vias 211 are completely exposed so as to form the local interconnect structure for semiconductor device of the present invention.

In various embodiments of the present invention, the Gate Last Technique may be integrated after said step; namely, the gate 203 and the gate dielectric layer therebelow are removed, then a new gate and a gate dielectric layer are formed again; the new gate may be made of a metal material, while the gate dielectric layer may be made of a high-k material.

It is also applicable in other embodiments of the present invention to remove the sidewall spacers 207 or outer sidewall spacers 213 on the two sides of the gate 203, and then to form new sidewall spacers or outer sidewall spacers; the new sidewall spacers or outer sidewall spacers may be made of a low-k material or a $Si_3N_4$ stressed thin film.

For the embodiment of the present invention, if the conductive contacts are formed immediately after removal of the sacrificial sidewall spacers, the surface of the entire device would be covered with the metal, which nonetheless is hard to remove completely. However, according to the method of the embodiment of the present invention, the sacrificial source/drain 215 occupy first the space where the source/drain contacts are desirably to be formed; after an interlayer dielectric layer is deposited, the unoccupied space on the surface of the entire semiconductor structure is filled completely by the dielectric; now, the sacrificial source/drain 215 are removed such that source/drain through-holes corresponding to the source/drain regions shall be formed on the flat surface of the semiconductor device structure. As such, a short circuit shall not arise when the contacts are formed within the through-holes.

Figure 15:
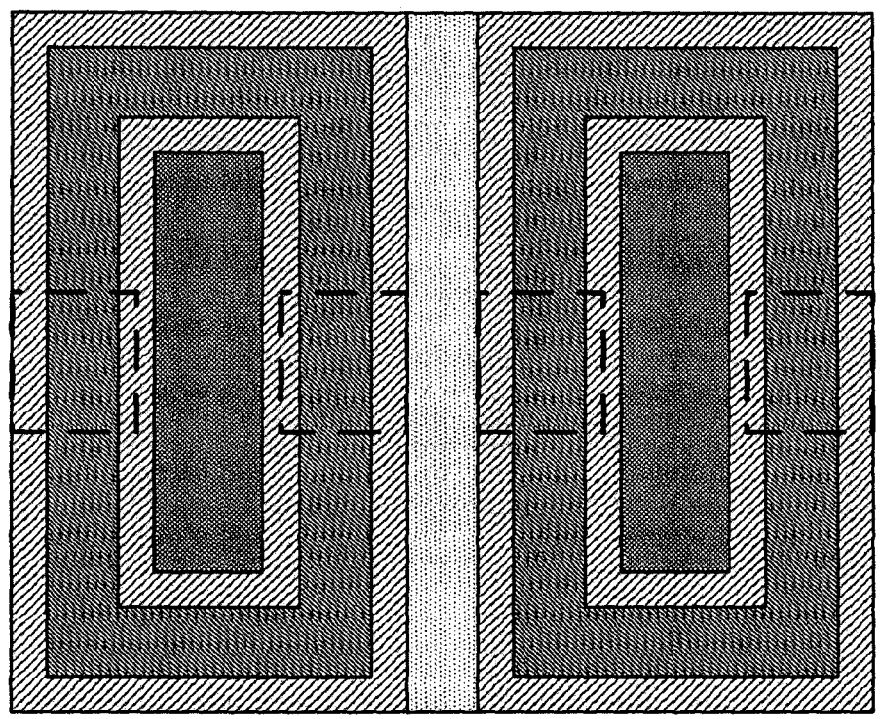
FIG. 15 is the top view of a local interconnect structure for a semiconductor device according to an embodiment of the present invention.

As shown, FIG. 15 illustrates a top view of a completely formed local interconnect structure for semiconductor device; the dashed blocks therein denote source/drain regions in the semiconductor device.

Figure 16:
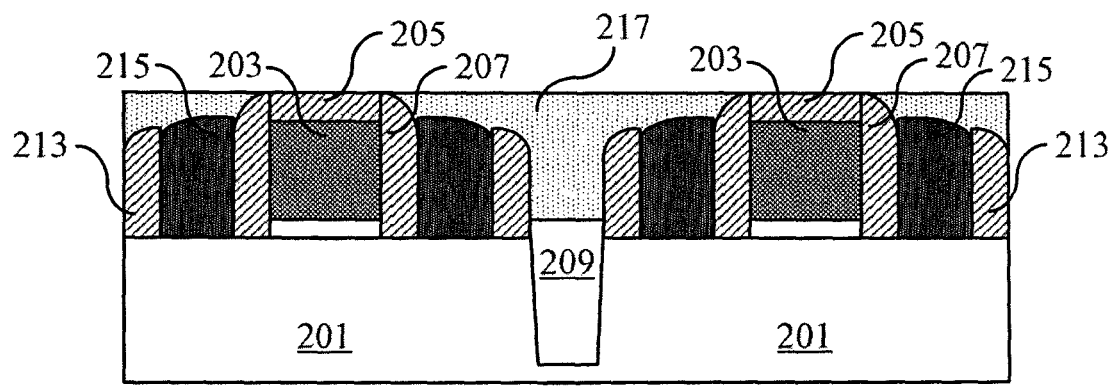
FIGS. 16-21 are cross-sectional views of intermediate structures of a local interconnect structure of a semiconductor device according to another embodiment of the present invention.

FIG. 16 to FIG. 21 illustrate the cross-sectional structural views of a local interconnect structure for semiconductor device manufactured according to another embodiment of the present invention. As shown in FIG. 16, after an interlayer dielectric layer 217 (not shown in FIG. 9) is deposited on the entire crystal surface of the semiconductor device, the entire crystal surface is planarized, and the planarization shall be stopped immediately when the cap layer 205 on the head of the gate 203 is exposed.

Figure 17:
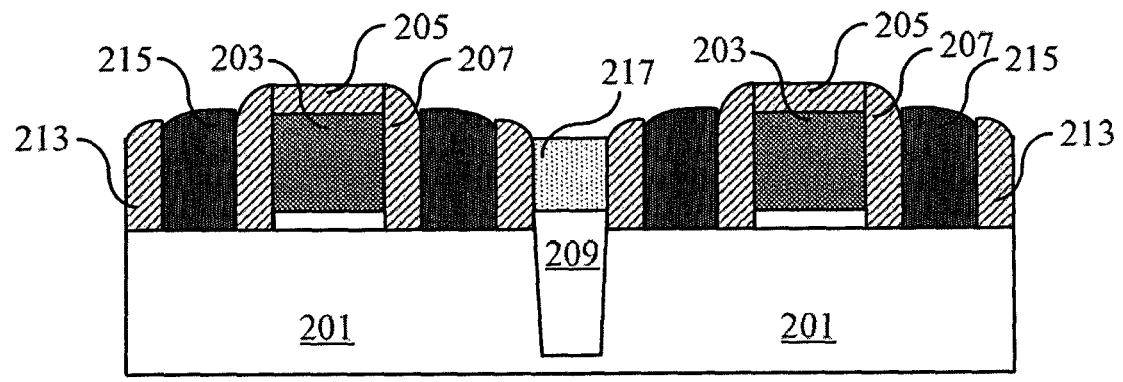

As shown in FIG. 17, the interlayer dielectric layer 217 on the entire crystal surface is etched till the sacrificial source/drain 215 are exposed.

In the present embodiment, the interlayer dielectric layer 217 may be removed by means of dry etching or wet etching till the sacrificial source/drain 215 are exposed.

Figure 18:
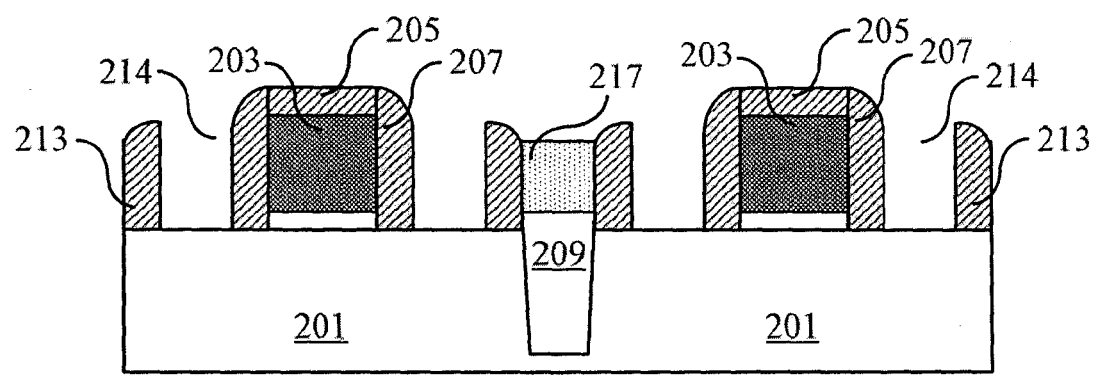

As shown in FIG. 18, the sacrificial source/drain 215 are removed to expose the source/drain regions on the semiconductor substrate 201; then new source/drain through-holes 214 are formed again between the sidewall spacer 207 and the outer sidewall spacer 213 on the same side of the gate 203.

In the present embodiment, the sacrificial source/drain 215 may be removed by means of dry etching or wet etching.

Figure 19:
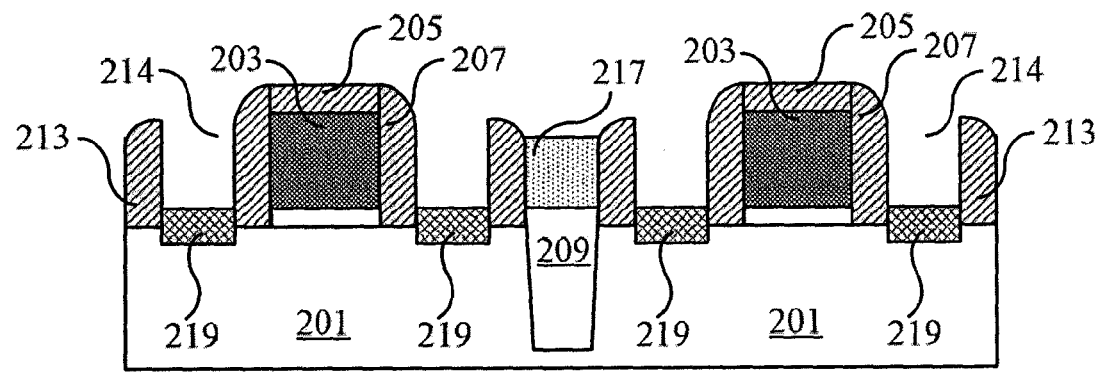

As shown in FIG. 19, source/drain contacts 219 of the local interconnect structure are formed at the source/drain regions at the bottoms of the source/drain through-holes 214.

In the present embodiment, the source/drain contacts 219 may be NiSi.

Figure 20:
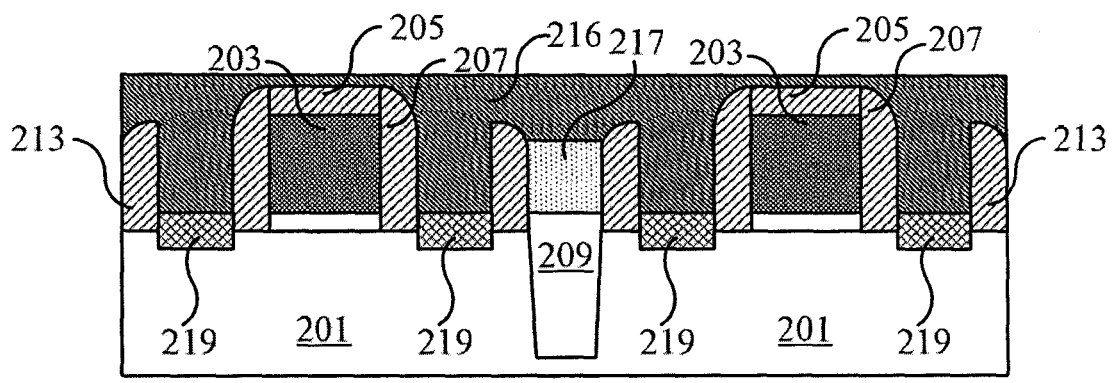

Then, as shown in FIG. 20, a conductive material 216 is deposited on the entire crystal surface, on which the semiconductor device is positioned; the conductive material 216 is filled into the source/drain through-holes 214 to form vias of the local interconnect structure.

In the present embodiment, the conductive material 216 may be Cu, W, Al, TiAl, etc.

Figure 21:
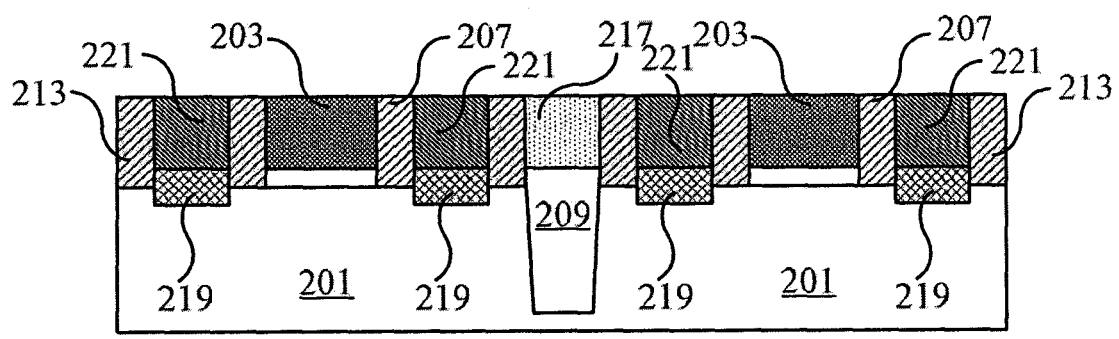

Finally, as shown in FIG. 21, the entire crystal surface is planarized till the gate 203 and the vias 221 are completely exposed, so as to form the local interconnect structure for semiconductor device of the present invention.

In different embodiments of the present invention, the Gate Last Technique may be integrated after aforesaid step; namely, the gate 203 and the gate dielectric layer therebelow are removed, then a new gate and a gate dielectric layer are formed again; and the new gate may be made of a metal material, while the gate dielectric layer may be made of a high-k material.

It is also applicable in other embodiments of the present invention to remove the sidewall spacers 207 or outer sidewall spacers 213 on two sides of the gate 203, and then to form new sidewall spacers or outer sidewall spacers; and the new sidewall spacers or outer sidewall spacers may be made of a low-k material or a $Si_3N_4$ stressed thin film.

In the present embodiment, the top view of the completely formed local interconnect structure for semiconductor device also is similar to the one illustrated in FIG. 15, wherein the dashed blocks therein denote source/drain regions in the semiconductor device.

As shown, FIG. 14 to FIG. 21 illustrate a local interconnect structure for semiconductor device manufactured according to the embodiment of the present invention. The structure comprises: a semiconductor substrate 201 with a gate 203 and sidewall spacers 207 formed on two sides of the gate 203; outer sidewall spacers 213 formed outside the sidewall spacers at certain spacing distance; source/drain through-holes formed between the sidewall spacer 207 and the outer sidewall spacer 213 on the same side; a conductive material 221 is filled into the source/drain through-holes; an interlayer dielectric layer 217 is filled into recesses between the outer sidewall spacers of the neighboring semiconductor devices. The gate dielectric layer under the gate 203 also is shown in the drawings.

Optionally, the sidewall spacers 207 may be $Si_3N_4$, and the outer sidewall spacers 221 are $Si_3N_4$.

Optionally, the outer sidewall spacers 221 may extend over the shallow trench isolation 209 between the neighboring semiconductor devices.

Preferably, in the embodiments of the present invention, the heads of the gate 203, the sidewall spacers 207, the outer sidewall spacers 213 and the conductive material 221 are at the same level.

The present invention proposes to form removable sacrificial sidewall spacers between the sidewall spacers and the outer sidewall spacers on two sides of the patterned gate on the semiconductor substrate, and to form the contact through-holes at the source/drain regions in the local interconnect structure between the sidewall spacer and the outer sidewall spacer on the same side of the gate immediately after removing the sacrificial sidewall spacers. Once the source/drain through-holes are filled with a conductive material to form vias, the height of the vias shall be same as the height of the gate. As such, the contact through-holes, which establishes electrical connection between the subsequent first layer of metal wiring and the source/drain regions or the gate region at a lower level in the local interconnect structure, shall be made in the same depth, which therefore prevents over-etching or insufficient etching of contact through-holes occurring during formation of contact through-holes in different regions of the semiconductor device, and also improves the filling effects on the contact through-holes at the meantime.

The present invention may integrate the Gate Last Technique at different stages to form again gates of different metal materials, and may further optimize the threshold voltage (Vth) and the saturated drain current (Idsat) between the source and the drain of the semiconductor device.

It is also applicable in the present invention that the sidewall spacers and outer sidewall spacers on two sides of the gate may be removed after formation of the local interconnect structure, and then new sidewall spacers or outer sidewall spacers may be formed again, and the material for the new sidewall spacers or the outer sidewall spacers may be a low-k material or a $Si_3N_4$ stressed thin film. The use of a low-k material is able to reduce the dielectric constants of the local interconnect dielectric/the interlayer dielectric layer, to reduce gate parasitic capacitance and to improve device performance; besides, the $Si_3N_4$ stressed thin film exhibits effects of pulling and pressing the channel material under the gate, so as to improve carrier mobility at the channel region thereby enhancing the reaction speed of a semiconductor device.

The outer sidewall spacers on the two sides of the gate in the present invention may be located over the source/drain of the semiconductor device, and also may extend till partly or entirely over the shallow trench isolation between the neighboring semiconductor devices; therefore, it becomes possible to adjust flexibly the widths or the positions of source/drain through-holes according to the needs of the widths of source/drain through-holes in practice, so as to improve utilization of chip area and to reduce manufacturing cost as well.

According to aforesaid technical solution, the present invention is able to manufacture contact through-holes, which establishes electrical connection between the subsequent first layer of metal wiring and the source/drain regions or the gate region at a lower level in the local interconnect structure, in the same depth; besides, the widths or positions of the contact through-holes may be arranged flexibly so as to adjust the depth to width ratio of the contact through-holes into a reasonable range, at which the conductive material shall be easily filled; therefore, it becomes convenient to use a metal material like Cu as the conductive material to fill the contact through-holes, which thus is favorable for improving electrical mobility effects of the metal interconnect wiring and also improves both yield and reliability of the product.

The present invention though is described with preferred embodiments, yet they should not be understood as limits to the present invention. A person of ordinary skill in the art should appreciate that any possible modification and change could be made without departing from the spirit and the scope of the invention. Accordingly, the scope of the present invention should be understood as the scope defined by the appended claims of the present invention.

What is claimed is:

1. A method for manufacturing a local interconnect structure for a semiconductor device, comprising:
   providing a semiconductor substrate with a gate, wherein the gate is sealed by a cap layer and sidewall spacers;
   forming sacrificial sidewall spacers outside the sidewall spacers;
   forming outer sidewall spacers at outer sides of the sacrificial sidewall spacers, wherein the material of the sacrificial sidewall spacers is different from the materials of the sidewall spacers and the outer sidewall spacers;
   removing the sacrificial sidewall spacers, forming source/drain through-holes between the sidewall spacers and the outer sidewall spacers which are located on the same side, and then forming sacrificial source/drain in the source/drain through-holes; and
   depositing an interlayer dielectric layer which is made of a material different from that of the sacrificial source/drain;
   performing planarization and removing the sacrificial source/drain;
   forming source/drain contacts at bottom of the source/drain through-holes;
   depositing a conductive material to fill the source/drain through-holes so as to form contact vias; and
   performing planarization to expose the gate and the contact vias.

2. The method according to claim 1, wherein at the step of performing planarization and removing the sacrificial source/drain: performing planarization to expose the sacrificial source/drain, and then the sacrificial source/drain is removed.

3. The method according to claim 2, wherein after performing planarization to expose the gate and the sacrificial source/drain, the method further comprises removing the gate and a gate dielectric layer therebelow to form a new gate and a new gate dielectric layer.

4. The method according to claim 3, wherein the new gate is made of a metal material.

5. The method according to claim 1, wherein in the step of performing planarization and removing the sacrificial source/drain: planarization is performed to expose the cap layer, the interlayer dielectric layer is etched to expose the sacrificial source/drain, and then the sacrificial source/drain is removed.

6. The method according to claim 1, wherein after performing planarization to expose the gate and the vias, the method further comprises removing the gate and a gate dielectric layer therebelow to form a new gate and a new gate dielectric layer.

7. The method according to claim 1, wherein after performing planarization to expose the gate and the vias, the method further comprises removing the sidewall spacers or the outer sidewall spacers, and then forming new sidewall spacers or new outer sidewall spacers.

8. The method according to claim 7, wherein the new sidewall spacers or the new outer sidewall spacers are made of a low-k material or a Si3N4 stressed thin film.

9. The method according claim 1, wherein the cap layer and the sidewall spacers are made of Si3N4, the sacrificial sidewall spacers at outer sides of the sidewall spacers are made of SiO2, and the outer sidewall spacers at outer sides of the sacrificial sidewall spacers are made of Si3N4.

10. The method according claim 1, wherein the outer sidewall spacers are located over the source/drain of the semiconductor device or extend over a shallow trench isolation between neighboring semiconductor devices.

11. The method according claim 1, wherein the sacrificial source/drain are grown by means of a Molecular Beam Epitaxy method.

12. The method according to claim 11, wherein the sacrificial source/drain is Si, SiGe or Si:C.

* * * * *